United States Patent
Kariya (10) Patent No.: US 7,842,609 B2
(45) Date of Patent: Nov. 30, 2010

(54) METHOD FOR MANUFACTURING SEMICONDUCTOR DEVICE

(75) Inventor: Atsushi Kariya, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 12/351,063

(22) Filed: Jan. 9, 2009

(65) Prior Publication Data
US 2009/0275197 A1    Nov. 5, 2009

(30) Foreign Application Priority Data
Apr. 30, 2008    (JP) .............................. 2008-118516

(51) Int. Cl.
  *H01L 21/44* (2006.01)
(52) U.S. Cl. ........................ 438/656; 438/628; 438/629; 438/639; 438/643; 438/644; 438/685; 257/E21.579; 257/E21.584
(58) Field of Classification Search ................. 438/628, 438/629, 639, 643, 644, 656, 685; 257/E21.579, 257/E21.584
See application file for complete search history.

(56) References Cited

U.S. PATENT DOCUMENTS

| 5,273,609 | A | * | 12/1993 | Moslehi ................. 156/345.28 |
| 6,309,966 | B1 | | 10/2001 | Govindarajan et al. |
| 6,403,478 | B1 | * | 6/2002 | Seet et al. .................... 438/672 |
| 7,141,494 | B2 | * | 11/2006 | Lee et al. .................... 438/627 |
| 2008/0105983 | A1 | * | 5/2008 | Jeong et al. ................. 257/774 |

FOREIGN PATENT DOCUMENTS

| JP | 11-087268 | 3/1999 |
| JP | 2001-525491 | 12/2001 |
| JP | 2007-009298 | 1/2007 |

* cited by examiner

*Primary Examiner*—Julio J Maldonado
(74) *Attorney, Agent, or Firm*—Young & Thompson (57) ABSTRACT

A hole is formed in an insulating layer. A semiconductor substrate is heated at a temperature of equal to or more than 330° C. and equal to or less than 400° C. Tungsten-containing gas and at least one of $B_2H_6$ gas and $SiH_4$ gas are introduced into a reaction chamber to thereby form a first tungsten layer. Subsequently, at least one of $H_2$ gas and inert gas is introduced into the reaction chamber, the temperature of the semiconductor substrate is raised to equal to or more than 370° C. and equal to or less than 410° C. with 30 or more seconds, and tungsten-containing gas is introduced into the reaction chamber to thereby form a second tungsten layer on the first tungsten layer.

14 Claims, 7 Drawing Sheets

FIG. 7A
COMPARISON EXAMPLE 1

FIG. 7B
COMPARISON EXAMPLE 2

FIG. 7C
EMBODIMENT 1

FIG. 7D
EMBODIMENT 2

FIG. 7E
EMBODIMENT 3

METHOD FOR MANUFACTURING SEMICONDUCTOR DEVICE

This application is based on Japanese patent application No. 2008-118516, the content of which is incorporated hereinto by reference.

BACKGROUND

1. Technical Field

The present invention relates to a method for manufacturing a semiconductor device using a process for forming a tungsten layer in a hole formed in an insulating layer.

2. Related Art

A contact plug is usually used to connect a transistor to an upper interconnect layer or to connect an interconnect layer to another interconnect layer. A contact plug is formed by forming a tungsten layer in a hole formed in an insulating interlayer, for example, as stated in Japanese Laid-open patent publication No. 11-87268, Japanese Laid-open patent publication No. 2007-9298, Japanese Patent Application National Publication (Laid-Open) No. 2001-525491, and U.S. Pat. No. 6,309,966.

Among Patent Documents, Japanese Laid-open patent publication No. 11-87268 discloses that in order to selectively grow a tungsten layer in a hole, a first tungsten layer is formed at a temperature of 200° C. to 260° C., and then a second tungsten layer is formed at a temperature of 280° C. to 340° C. According to Japanese Laid-open patent publication No. 11-87268, if the temperature is higher than the above temperature, resistance becomes larger, and the selective growth is impossible.

Japanese Patent Application National Publication (Laid-Open) No. 2001-525491 discloses that when a tungsten layer is formed by a nucleation step and a bulk deposition step, a pressure increasing step is performed between the nucleation step and the bulk deposition step. In the pressure increasing step, a tungsten-containing source is not contained in process gas. In Japanese Patent Application National Publication (Laid-Open) No. 2001-525491, a substrate temperature is set to 325° C. to 450° C.

SUMMARY

In order to make the resistance of a contact plug lower with maintaining reliability of the contact plug, it is effective to improve the fill capability of the tungsten layer to the hole formed in the insulating layer and to enlarge a grain size of the tungsten layer. On the other hand, it is important to improve productivity of a processing for manufacturing a semiconductor device.

In one embodiment, there is provided a method for manufacturing a semiconductor device, comprising: forming a hole in an insulating layer arranged above a surface of a semiconductor substrate; forming a first tungsten layer in the hole with heating the semiconductor substrate carried into a reaction chamber at a temperature of equal to or more than 330° C. and equal to or less than 400° C. and introducing tungsten-containing gas and at least one of $B_2H_6$ gas and $SiH_4$ gas into the reaction chamber; introducing at least one of $H_2$ gas and inert gas into the reaction chamber and raising the temperature of the semiconductor substrate to equal to or more than 370° C. and equal to or less than 410° C. with 30 or more seconds; and forming a second tungsten layer on the first tungsten layer by introducing tungsten-containing gas into the reaction chamber.

According to the present invention, the fill capability of the tungsten layer to the hole formed in the insulating layer is improved, and the grain size of the tungsten layer is enlarged. Further, productivity of the semiconductor device is improved.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Hereinafter, an exemplary embodiment of the present invention will be described with reference to attached drawings. In drawings, like reference numerals denote like parts, and duplicated description will not be repeated.

Figure 1:
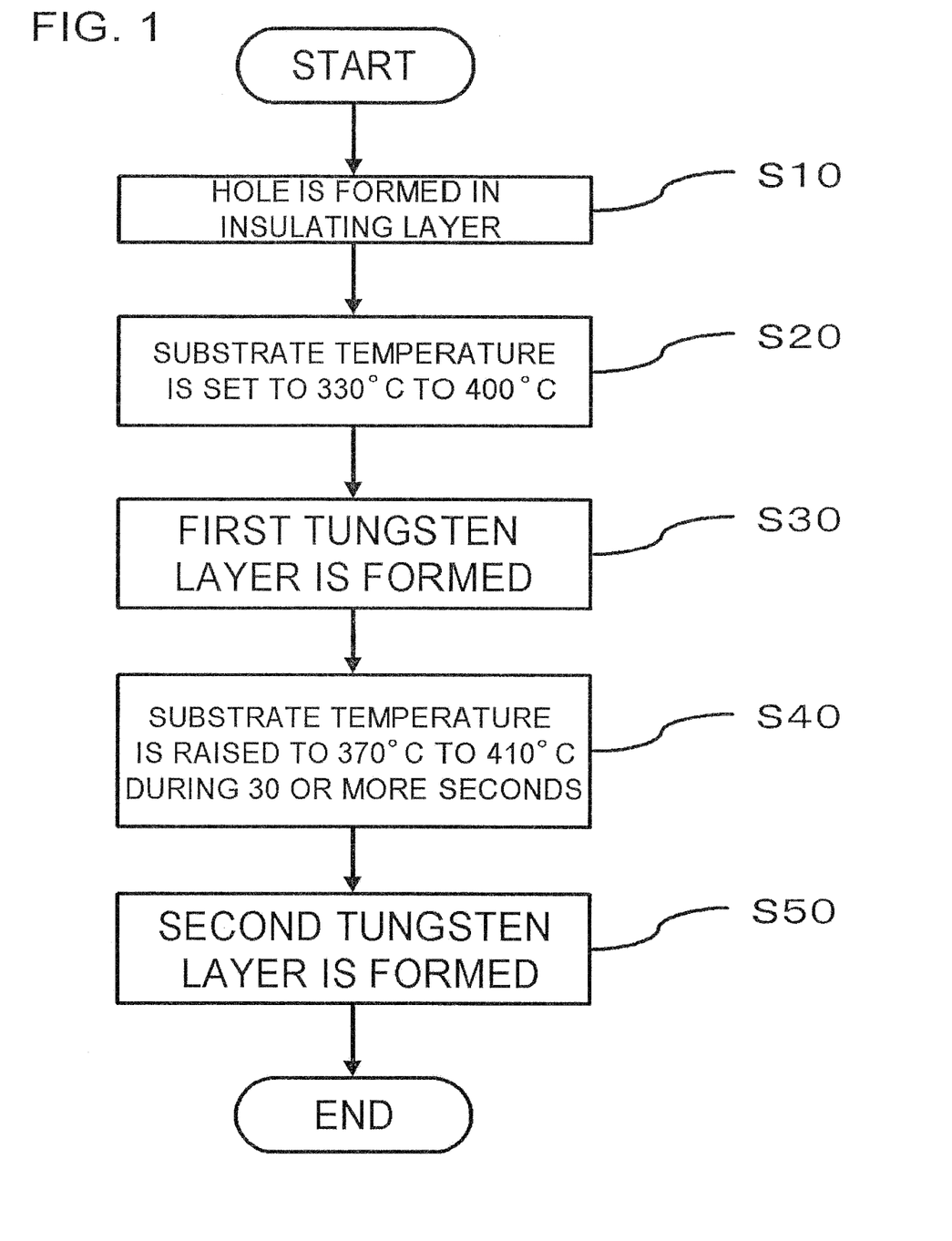
FIG. 1 is a flowchart explaining a method for manufacturing a semiconductor device according to an exemplary embodiment of the present invention.

FIG. 1 is a flowchart illustrating a method for manufacturing a semiconductor device according to an exemplary embodiment of the present invention. In the method for manufacturing the semiconductor device, a hole is first formed in an insulating layer disposed above a surface of a semiconductor substrate (S10). The semiconductor substrate carried into a reaction chamber is heated at a temperature of equal to or more than 330° C. and equal to or less than 400° C. (S20). Subsequently, tungsten-containing gas and at least one of $B_2H_6$ gas and $SiH_4$ gas are introduced into the reaction chamber to thereby form a first tungsten layer in the hole (S30). Then, at least one of $H_2$ gas and inert gas is introduced into the reaction chamber, and the temperature of the semiconductor substrate is raised to equal to or more than 370° C. and equal to or less than 410° C. with 30 or more seconds (S40) Then, tungsten-containing gas is introduced into the reaction chamber to thereby form a second tungsten layer on the first tungsten layer (S50).

Next, the method for manufacturing the semiconductor device according to the exemplary embodiment of the present invention will be described in detail with reference to cross-sectional views of FIGS. 2 to 5.

Figure 2:
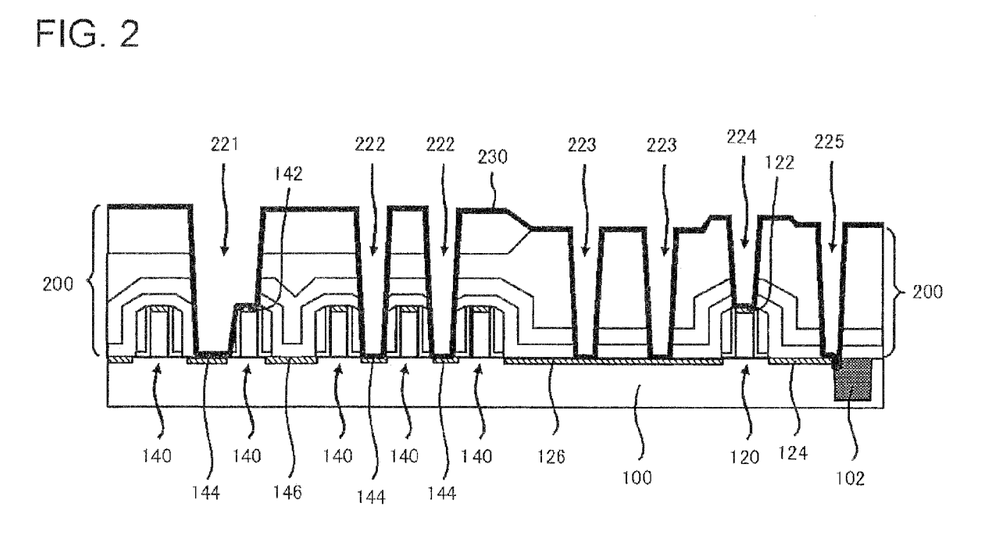
FIG. 2 is across-sectional view illustrating the method for manufacturing the semiconductor device according to the exemplary embodiment of the present invention.

First, as shown in FIG. 2, an isolation layer 102 and transistors 120 and 140 are formed on a semiconductor substrate 100 such as, for example, a silicon substrate. The transistors 120 and 140 include silicide layers 122 and 142 on a gate electrode and silicide layers 124, 126, 144, and 146 on diffusion layers which work a source or a drain. The diffusion layer having the silicide layer 126 functions as not only a component of the transistor 120 but also a component of the transistor 140 located nearby the transistor 120. Then, an insulating interlayer 200 is formed on the transistors 120, 140 and the isolation layer 102. In FIG. 2, the insulating interlayer 200 has a multi-layer structure.

Subsequently, the insulating interlayer 200 is selectively removed using, for example, a mask pattern and an etching technique, so that holes 221, 222, 223, 224, and 225 are formed in the insulating interlayer 200. The hole 221 provides a space for forming a contact plug on the silicide layer 144 on the diffusion layer and the silicide layer 142 on the gate electrode in the transistor 140. The hole 222 provides a space for forming a contact plug on the silicide layer 144 on the diffusion layer of the transistor 140. The hole 223 provides a space for forming a contact plug on the silicide layer 126. The hole 224 provides a space for forming a contact plug on the silicide layer 122 on the gate electrode of the transistor 120. The hole 225 provides a space for forming a contact plug on the silicide layer 124 on the diffusion layer of the transistor 120. The diameter of the holes 221 to 225 is, for example, equal to or more than 50 nm and equal to or less than 130 nm.

Then, the semiconductor substrate 100 is carried into the reaction chamber. Barrier layers 230 are formed on bottom surfaces and sidewalls of the holes 221 to 225 and on the insulating interlayer 200. The barrier layer 230 functions to suppress tungsten from being diffused. The barrier layer 230 is formed by layers that a Ti layer and a TiN layer are deposited in order, or by a TiN layer.

Figure 3:
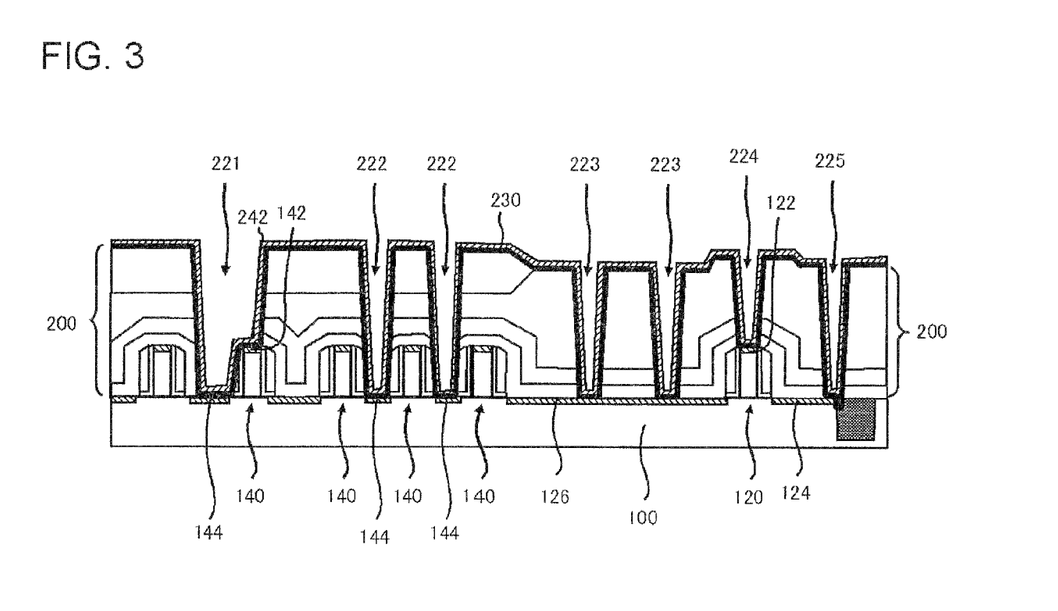
FIG. 3 is a cross-sectional view illustrating the next process of FIG. 2.

Then, as shown in FIG. 3, the semiconductor substrate carried into the reaction chamber is heated at a temperature of equal to or more than 330° C. to equal to or less than 400° C., preferably, equal to or more than 330° C. to equal to or less than 360° C. Tungsten-containing gas, carrier gas, and at least one of $B_2H_6$ gas and $SiH_4$ gas are introduced into the reaction chamber. As a result, a first tungsten layer 242 is formed on the barrier layer 230. At this time, the first tungsten layer 242 is formed even above a surface of the insulating interlayer 200. The first tungsten layer 242 has the thickness of, for example, equal to or more than 2 nm and equal to or less than 10 nm. The first tungsten layer 242 is formed even on the barrier layer 230 formed in the holes 221 to 225. For example, $WF_6$ is used as tungsten-containing gas. For example, Ar is used as carrier gas, but carrier gas may contain $N_2$. Tungsten-containing gas and at least one of $B_2H_6$ gas and $SiH_4$ gas can be introduced into the reaction chamber simultaneously or alternately. The former is, for example, an atomic layer deposition (ALD). The latter preferably includes a process for putting purge gas (for example, same gas as carrier gas) between a process for introducing at least one of $B_2H_6$ gas and $SiH_4$ gas and a process for introducing tungsten-containing gas.

Subsequently, at least one of $H_2$ gas and inert gas is introduced into the reaction chamber, and the temperature of the semiconductor substrate 100 is raised to equal to or more than 370° C. and equal to or less than 410° C. with 30 or more seconds. For example, rare gas such as Ar and $N_2$ can be used as inert gas. Gases used in this process may be same as gases used in a process for forming a second tungsten layer 240 which will be described later without tungsten-containing gas is excluded. The temperature is preferably raised at a rate of equal to or more than 0.5° C./second and equal to or less than 2.5° C./second. A time taken to raise the temperature is preferably equal to or more than 40 seconds.

Figure 4:
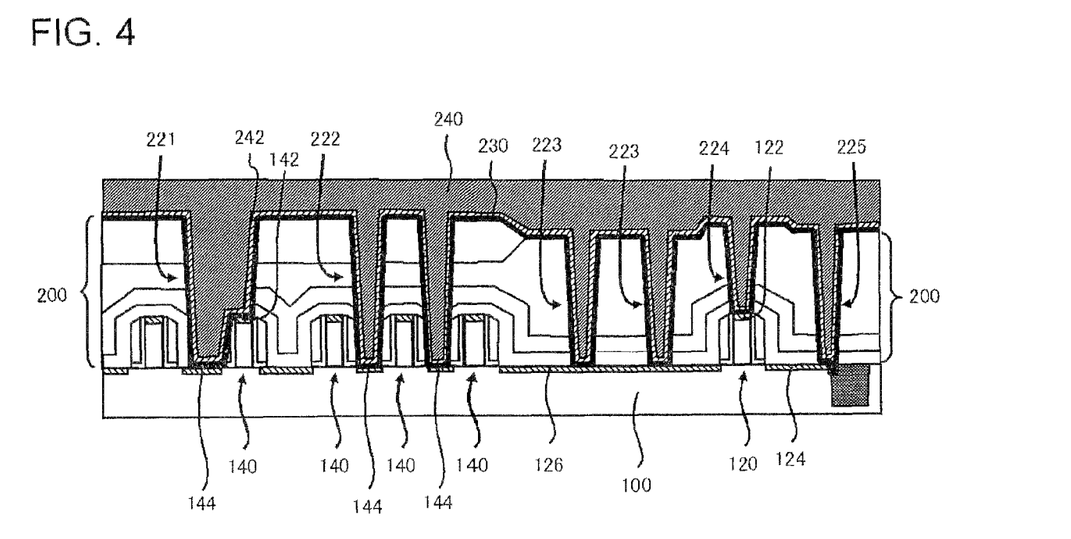
FIG. 4 is a cross-sectional view illustrating the next process of FIG. 3.

Subsequently, as shown in FIG. 4, tungsten-containing gas, $H_2$ gas and carrier gas are introduced into the reaction chamber. As a result, the second tungsten layer 240 is formed on the first tungsten layer 242. At this time, the second tungsten layer 240 is formed even above a surface of the insulating interlayer 200. The second tungsten layer 240 has the thickness of, for example, equal to or more than 100 nm and equal to or less than 400 nm. The second tungsten layer 240 is also formed even on the first tungsten layer 242 formed in the holes 221 to 225. For example, $WF_6$ is used as tungsten-containing gas. For example, Ar is used as carrier gas, but carrier gas may contain $N_2$. In case where carrier gas contains $N_2$, a surface of the second tungsten layer 240 becomes smooth.

Figure 5:
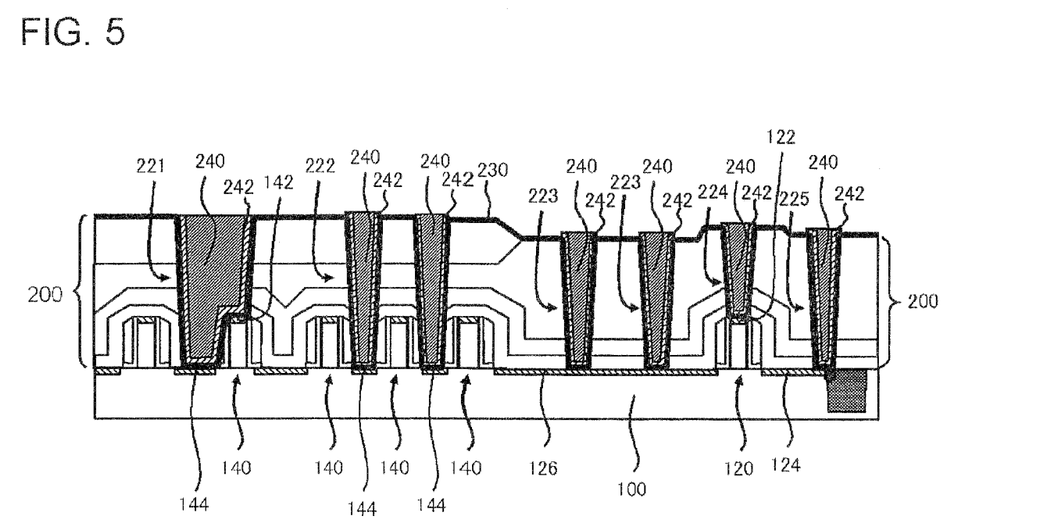
FIG. 5 is a cross-sectional view illustrating the next process of FIG. 4.

Thereafter, as shown in FIG. 5, portions of the first tungsten layer 242 and the second tungsten layers 240 above the insulating interlayer 200 are removed. This removing process is performed using an etch-back technique or a chemical mechanical polishing (CMP) technique. As a result, a contact plug which includes the first tungsten layer 242 and the second tungsten layer 240 is embedded in the holes 221 to 225. Also, in this process, a portion of the barrier layer 233 above the insulating interlayer 200 may be removed.

Next, the effect of the present invention will be described. The substrate temperature when the first tungsten layer 242 is formed is equal to or more than 330° C. and equal to or less than 400° C., preferably, equal to or more than 330° C. and equal to or less than 360° C. As a result, the step coverage of the first tungsten layer 242 to the holes 221 to 225 is improved, and thus the fill capability of the second tungsten layer 240 is improved, whereby reliability of the contact plug is improved. If the substrate temperature is raised more than it, the step coverage of the first tungsten layer 242 to the holes 221 to 225 gets worse, and thus the fill capability of the second tungsten layer 240 gets worse.

The substrate temperature when the second tungsten layer 240 is formed is higher than when the first tungsten layer 242 is formed and is equal to or more than 370° C. and equal to or less than 410° C.

Figure 6:
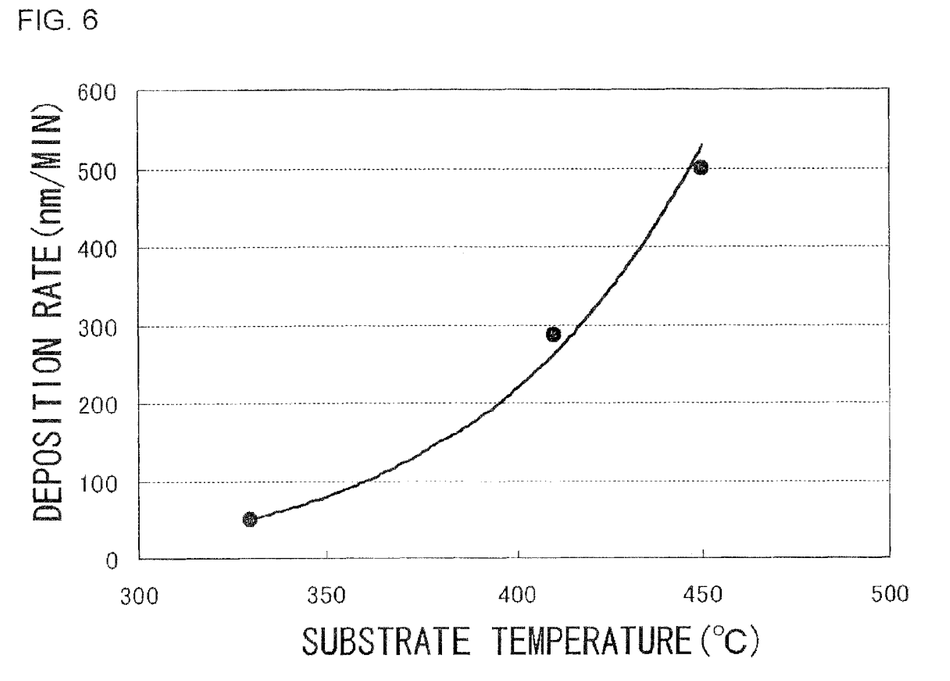
FIG. 6 is a graph illustrating that the layer forming speed of a second tungsten layer depends on the substrate temperature.

FIG. 6 is a graph illustrating that the deposition rate of the second tungsten layer 240 depends on the substrate temperature. According to the graph, the deposition rate of the second tungsten layer 240 is 50 nm/minute when the substrate temperature is 330° C. The deposition rate of the second tungsten layer 240 are 285 nm/minute and 500 nm/minute respectively, when the substrate temperatures are 410° C. and 450° C. Therefore, it is understood that if the substrate temperature is raised before the second tungsten layer 240 is formed, the deposition rate is increased, whereby productivity of the semiconductor device is improved.

Before forming the second tungsten layer 240 and after forming the first tungsten layer 242, at least one of $H_2$ gas and inert gas is introduced into the reaction chamber, and the temperature of the semiconductor substrate is raised to equal to or more than 370° C. and equal to or less than 410° C. with 30 or more seconds. As a result, gas absorbed into the first tungsten layer 242 is removed, so the grain size of the second tungsten layer 240 is enlarged, whereby resistance of the contact plug is lowered. This effect is remarkable when $SiH_4$ gas other than $B_2H_6$ gas is used in the process for forming the first tungsten layer 242.

As described above, according to the exemplary embodiment of the present invention, the substrate temperature when forming the first tungsten layer 242 is set to equal to or more than 330° C. and equal to or less than 400° C., the substrate temperature when forming the second tungsten layer 240 is set to equal to or more than 370° C. and equal to or less than 410° C., at least one of H₂ gas and inert gas is introduced into the reaction chamber before forming the second tungsten layer 240 after forming the first tungsten layer 242, and the substrate temperature is raised with 30 or more seconds.

embodiments 2 and 3, that is, when the length of the time raising temperature of the substrate is 40 or more seconds.

Table 1 shows the manufacturing condition, the sheet resistance, the layer thickness, and the specific resistance of the embodiments 1 to 3 and the comparison examples 1 and 2.

TABLE 1

|  | TEMPERATURE RAISING TIME (SECOND) | LAYER FORMING TEMPERATURE OF FIRST TUNGSTEN LAYER (° C.) | LAYER FORMING TEMPERATURE OF SECOND TUNGSTEN LAYER (° C.) | SHEET RESISTANCE (Ω/□.) | LAYER THICKNESS (nm) | SPECIFIC RESISTANCE (uΩcm) |
|---|---|---|---|---|---|---|
| EMBODIMENT 1 | 30 | 350 | 390 | 0.484 | 266 | 12.9 |
| EMBODIMENT 2 | 40 | 350 | 390 | 0.459 | 254 | 11.7 |
| EMBODIMENT 3 | 50 | 350 | 390 | 0.452 | 252 | 11.4 |
| COMPARISON EXAMPLE 1 | 8 | 350 | 390 | 0.538 | 289 | 15.6 |
| COMPARISON EXAMPLE 2 | 20 | 350 | 390 | 0.529 | 263 | 13.9 |

Accordingly, resistance can lowered while improving reliability of the contact plug, and productivity of the semiconductor device can be improved.

In FIGS. 2 to 5, the contact plug is embedded in the insulating interlayer of a first layer, but the technology disclosed in the exemplary embodiment described above can be applied when the contact plug is formed in the insulating interlayer of a second or more above layer.

Embodiment

Samples according to embodiments 1 to 3 are manufactured by the method disclosed in the exemplary embodiment of the present invention described above in each embodiment, when forming the first tungsten layer 242, SiH₄ gas, WF₆ gas, and Ar gas are introduced into the reaction chamber, and the substrate temperature is set to 350° C. In this process, SiH₄ gas and WF₆ gas are alternately introduced total six times. Also, when forming the second tungsten layer 240, H₂ gas, WF₆ gas, N₂ gas, and Ar gas are introduced into the reaction chamber, and the substrate temperature is set to 390° C. The substrate temperature is raised while forming the second tungsten layer 240 after forming the first tungsten layer 242. The length of the time raising temperature of the substrate is set to 30 seconds in the embodiment 1, 40 seconds in the embodiment 2 and 50 seconds in the third embodiment.

Also, samples according to comparison examples 1 and 2 are manufactured. The manufacturing conditions of the comparison examples 1 and 2 are same as those of the embodiments 1 to 3 except that the length of the time raising temperature of the substrate is set to 8 seconds and 20 seconds, respectively.

Figure 7A:
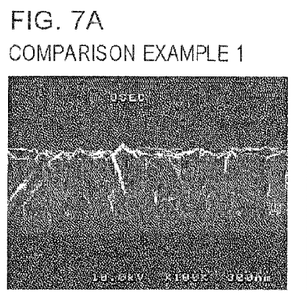
FIGS. 7A to 7E are scanning electron microscope (SEM) images which show cross sections of samples according to comparison examples 1 and 2 and embodiments 1 to 3.
Figure 7B:
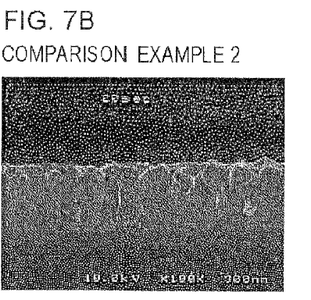
Figure 7C:
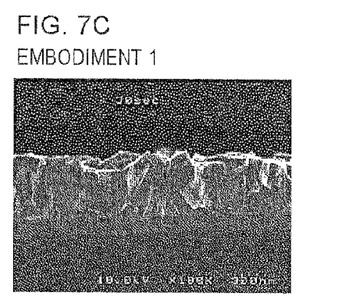
Figure 7D:
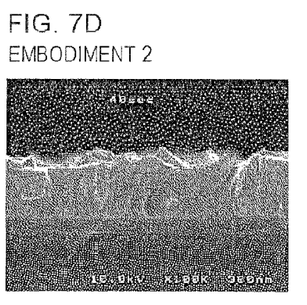
Figure 7E:
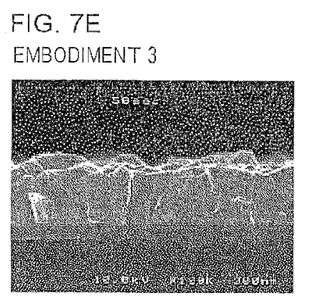

FIGS. 7A to 7E are scanning electron microscope (SEM) images which show cross sections of the samples according to the comparison examples 1 and 2 and the embodiments 1 to 3. These photographs show the first tungsten layer 242 and the second tungsten layer 240 which are formed on the insulating interlayer. When FIGS. 7A and 7B are compared to FIGS. 7C to 7E, it is understood that the grain size of the second tungsten layer 240 in the embodiments 1 to 3 is larger than the grain size of the second tungsten layer 240 in the comparison examples 1 and 2. Such a tendency is remarkable in the In the samples of the comparison examples 1 and 2, the sheet resistances are 0.538Ω/□ and 0.529Ω/□, respectively. On the other hand, in the samples of the embodiments 1 to 3, the sheet resistances are 0.484Ω/□, 0.459Ω/□, and 0.452Ω/□, respectively. It is shown that the sheet resistances of the samples of the embodiments are lower by equal to or more than 0.04Ω/□ compared to those of the samples of the comparison examples.

Also, in the samples of the comparison examples 1 and 2, the specific resistances are 15.6 μΩ·cm, 13.9 μΩ·cm, respectively. On the other hand, in the samples of the embodiments 1 to 3, the specific resistances are 12.9 μΩ·cm, 11.7 μΩ·cm, and 11.4 μΩ·cm, respectively. It is shown that the specific resistances of the samples of the embodiments are lower by equal to or more than 1 μΩ·cm compared to those of the samples of the comparison examples.

Hereinbefore, the exemplary embodiment of the present invention has been described with reference to the drawings, but these are for illustrative purposes and can employ various configurations other than described above.

It is apparent that the present invention is not limited to the above embodiment, and may be modified and changed without departing from the scope and spirit of the invention.

What is claimed is:

1. A method of manufacturing a semiconductor device, comprising, in the following order:
   forming a hole in an insulating layer arranged above a surface of a semiconductor substrate;
   forming a first tungsten layer in said hole by heating said semiconductor substrate carried into a reaction chamber at a temperature of equal to or more than 330° C. and equal to or less than 400° C. and introducing tungsten-containing gas and at least one of B₂H₆ gas and SiH₄ gas into said reaction chamber;
   introducing at least one of H₂ gas and inert gas into said reaction chamber and raising the temperature of said semiconductor substrate to equal to or more than 370° C. and equal to or less than 410° C. with 30 or more seconds; and
   forming a second tungsten layer on said first tungsten layer by introducing tungsten-containing gas into said reaction chamber.

2. The method according to claim 1,
wherein in said forming said first tungsten layer, said semiconductor substrate is heated at a temperature of equal to or more than 330° C. and equal to or less than 360° C.

3. The method according to claim 1,
wherein in said temperature of the semiconductor substrate, the temperature raising speed is equal to or more than 0.5° C./seconds and equal to or less than 2.5° C./seconds.

4. The method according to claim 1,
wherein in said for raising the temperature of said semiconductor substrate, 40 or more seconds is taken to raise the temperature of said semiconductor substrate.

5. The method according to claim 1,
wherein in said forming said first tungsten layer and in said forming said second tungsten layer, said first tungsten layer and said second tungsten layer are formed even above a surface of said insulating layer,
and after forming said second tungsten layer, a step for removing portions of said first tungsten layer and said second tungsten layer above the surface of said insulating layer is performed.

6. The method according to claim 1,
wherein in said forming said first tungsten layer, $SiH_4$ gas and tungsten-containing gas are introduced into said reaction chamber.

7. A method of manufacturing a semiconductor device, comprising:
forming a hole in an insulating layer arranged above a surface of a semiconductor substrate;
forming a first tungsten layer on a bottom and side surfaces of said hole by heating said semiconductor substrate in a reaction chamber to a first temperature of equal to or more than 330° C. and equal to or less than 400° C. and introducing tungsten-containing gas and at least one of $B_2H_6$ gas and $SiH_4$ gas into said reaction chamber;
introducing at least one of $H_2$ gas and inert gas into said reaction chamber and raising a temperature of said semiconductor substrate to a second temperature higher than said first temperature and equal to or more than 370° C. and equal to or less than 410° C. with 30 or more seconds; and
forming a second tungsten layer on said first tungsten layer by introducing tungsten-containing gas into said reaction chamber, said second tungsten layer filling said hole.

8. The method according to claim 7,
wherein in said forming said first tungsten layer, said semiconductor substrate is heated at a temperature of equal to or more than 330° C. and equal to or less than 360° C.

9. The method according to claim 7,
wherein in said heating the semiconductor substrate, a temperature raising speed is equal to or more than 0.5° C./seconds and equal to or less than 2.5° C./seconds.

10. The method according to claim 7,
wherein in said raising the temperature of said semiconductor substrate, 40 or more seconds is taken to raise the temperature of said semiconductor substrate.

11. The method according to claim 7,
wherein in said forming said first tungsten layer and in said forming said second tungsten layer, said first tungsten layer and said second tungsten layer are formed above a surface of said insulating layer,
and after forming said second tungsten layer, a step for removing portions of said first tungsten layer and said second tungsten layer above the surface of said insulating layer.

12. The method according to claim 7,
wherein in said forming said first tungsten layer, $SiH_4$ gas and tungsten-containing gas are introduced into said reaction chamber.

13. The method according to claim 7,
wherein a barrier layer is formed on a bottom and side wall of said hole prior to forming said first tungsten layer.

14. The method according to claim 7,
wherein said tungsten-containing gas and $SiH_4$ are introduced into the reaction chamber simultaneously.

* * * * *